United States Patent [19]

Imahashi

[11] Patent Number: 5,414,244
[45] Date of Patent: May 9, 1995

[54] SEMICONDUCTOR WAFER HEAT TREATMENT APPARATUS

[75] Inventor: Issei Imahashi, Yamanashi, Japan

[73] Assignee: Tokyo Electron Limited, Tokyo, Japan

[21] Appl. No.: 230,793

[22] Filed: Apr. 21, 1994

[30] Foreign Application Priority Data

Apr. 21, 1993 [JP] Japan .................. 5-119156

[51] Int. Cl.6 ............................................. H05B 1/02
[52] U.S. Cl. .................. 219/497; 219/413;
219/405; 219/392; 219/407; 392/416; 432/121;
432/209
[58] Field of Search .............. 219/39, 405, 411–413,
219/483–486, 501, 497, 494, 392; 392/416, 407,
411, 418; 432/120, 121, 206, 122, 209, 215

[56] References Cited

U.S. PATENT DOCUMENTS

| | | | |
|---|---|---|---|
| 4,081,313 | 3/1978 | McKeilly et al. | 156/610 |
| 4,481,406 | 11/1984 | Muka | 219/411 |
| 4,554,437 | 11/1985 | Wagner et al. | 219/388 |
| 5,187,771 | 2/1993 | Uchida | 392/416 |
| 5,308,955 | 5/1994 | Watanabe | 219/390 |
| 5,324,920 | 6/1994 | Nakao | 219/542 |

FOREIGN PATENT DOCUMENTS 234164 8/1990 Japan .

Primary Examiner—Mark H. Paschall
Attorney, Agent, or Firm—Oblon, Spivak, McClelland, Maier & Neustadt

[57] ABSTRACT

A heat treatment apparatus according to the present invention includes a process tube which heat rays are able to penetrate, a holding member for holding an object to be treated in the process tube, two temperature regulation plates arranged opposite and close to the object held by the holding member, for regulating an amount of heat rays reaching to the object, a heating unit for heating the object in the process tube, a cooling unit for cooling the object heated by the heating unit, a temperature sensor for sensing temperatures of the two temperature regulation plates, and a controller for controlling the heating unit based on the temperature profile acquired in advance and the temperatures detected by the temperature sensor.

14 Claims, 4 Drawing Sheets

SEMICONDUCTOR WAFER HEAT TREATMENT APPARATUS

BACKGROUND OF THE INVENTION

1. Field of the Invention

The present invention relates to a heat treatment apparatus for heating a semiconductor wafer or the like by irradiating a substrate thereof with heat rays.

2. Description of the Related Art

An irradiation type heat treatment apparatus is used for thermal diffusion treatment, thermal oxidation treatment, or annealing treatment of semiconductor wafers in the process of manufacturing semiconductor devices. This heat treatment includes a plurality of halide lamps in a process tube in order to directly emit light beams to the wafer. In the heat treatment of a single wafer, the temperature in the process tube including the wafer is detected with high precision in order to optimize the temperature of the heat treatment. In the conventional heat treatment apparatus, the temperature of the wafer is detected by a radiation thermometer.

However, since, in the conventional apparatus, heat rays from the wafer is influenced by the surface condition of the wafer, an error in the detected temperature results. The surface condition of the wafer varies according to types of thin films formed on the wafer. If heat rays from the wafer are detected, there occurs considerably greater irregularities and variety of the amounts and wavelengths of the detected heat rays. It is thus difficult to control the temperature of the wafer itself with high precision, and a difference occurs between a process temperature of one wafer and a process temperature of an other wafer, with the result that thermal treatment of the wafer cannot be performed uniformly.

Jpn. Pat. Appln. KOKAI Publication No. 61-129834 (Jpn. Pat. Appln. KOKOKU Publication No. 2-34164) discloses a heat treatment apparatus, which has halide lamps around a transparent process tube, for irradiating a wafer with heat rays through the wall of the process tube. This apparatus includes a heat ray absorption plate between the process tube and wafer. The heat ray absorption plate is made of quartz or another material having an infrared rays penetrable characteristic similar to that of quartz. It absorbs some of the heat rays (secondary heat rays having a long wavelength of 4 $\mu$m or more) radiating from the wall of the process tube to thereby prevent the wafer from being overheated.

In the apparatus of the Japanese Publication, however, the temperature of the wafer cannot be controlled with high precision, even though the secondary heat rays radiating from the process tube to the wafer can be restricted by the heat ray absorption plate. Since, furthermore, the wafer is heated indirectly through the wall of the process tube and the heat ray absorption plate, a thermal response is slow, and the temperature of the entire wafer cannot be quickly increased or decreased to a target one.

SUMMARY OF THE INVENTION

An object of the present invention is to provide a heat treatment apparatus capable of uniformly heating a substrate, quickly increasing or decreasing the temperature of the entire substrate, and controlling the temperature of heat treatment of the substrate with high precision.

According to an aspect of the present invention, there is provided a heat treatment apparatus comprising:

a process tube which heat rays are allowed to penetrate;

a holding member for holding an object to be treated in the process tube;

temperature regulation means arranged opposite and close to the object held by the holding means, for regulating an amount of heat rays reaching to the object;

heating means for heating the object in the process tube;

cooling means for cooling the object heated by the heating means;

temperature detecting means for detecting temperatures of the temperature regulation means; and control means for controlling the heating means based on a temperature profile acquired in advance and the temperatures of the temperature regulation means detected by the temperature detecting means.

It is desirable to form the temperature regulation plates of a material which is easy to absorb infrared rays having a long wavelength and, in particular, it is desirable to form them of silicon carbide, graphite, silicon or the like.

The gist of the present invention lies in that the temperature of a wafer to be treated can be indirectly controlled with high precision by controlling the temperature of a temperature regulation plate arranged close to the wafer, instead of measuring the temperature of the wafer itself. This temperature control can be attained for the following reason. It is very difficult to measure the temperature of the wafer since the wafer is constantly replaced with another, whereas it is easy to measure the temperature of the temperature regulation plate since the temperature regulation plate is fixed and a highly precise temperature detecting means such as a thermocouple is directly fixed to the temperature regulation plate. Although the heat capacity of the temperature regulation plate is very small, if a temperature control feedback loop including the temperature detecting means is formed, the heat capacity is increased to several tens to hundred times as large as that of the wafer, with the result that a difference in temperature among the wafers due to the replacement of the wafers can be reduced greatly.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will now be described, with reference to the accompanying drawings.

Figure 1:
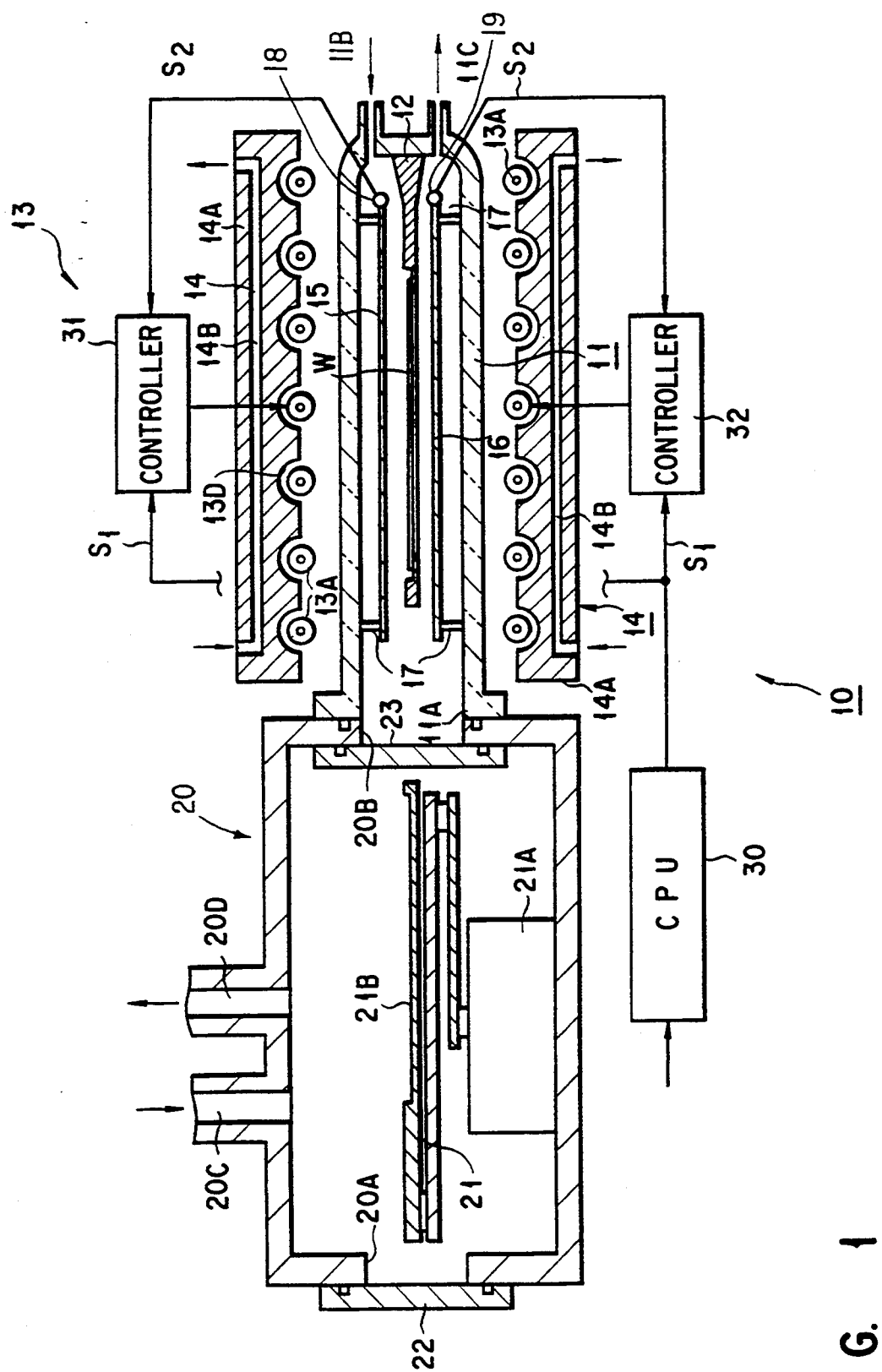
FIG. 1 is a cross-sectional block diagram showing a heat treatment apparatus according to a first embodiment of the present invention.
Figure 2:
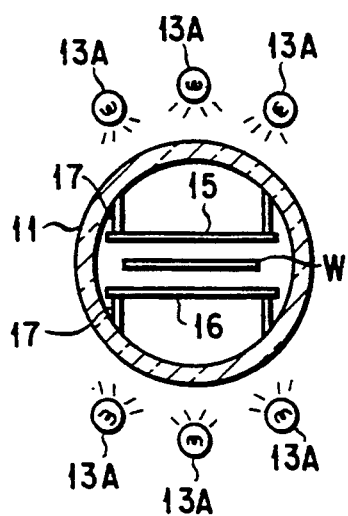
FIG. 2 is a transverse-sectional view of a process tube of the heat treatment apparatus shown in FIG. 1.

As shown in FIG. 1, the apparatus 10 includes a process tube 11 and a load lock chamber 20. The apparatus 10 includes a heating unit 13 and a cooling unit 14 above the process tube 11. The apparatus 10 also includes the heating unit 13 and the cooling unit 14 below the process tube 11. The shape of the process tube 11 is compressed cylinder or cylindrical cylinder, and the thickness of the process tube 11 ranges from 1 to 10 mm. The process tube 11 is made of transparent quartz to allow heat rays (mainly infrared rays) from a plurality of lamps 13A of the heating units 13 to penetrate therethrough. The load lock chamber 20 is a box constituted by a stainless steel plate or an aluminum plate, and openings 20A and 20B are formed at the front and rear of the box, respectively. The opening 20A at the front is provided with a gate valve 22, and the opening 20B at the rear is provided with a gate valve 23. When the gate valve 22 is opened, the load lock chamber 20 communicates with an atmosphere of a clean room. When the gate valve 23 is opened, the chamber 20 communicates with that of the process tube 11.

Both ends of the process tube 11 are open. One of the open ends is provided with a flange 11A connected to the load lock chamber 20. If the gate valve 23 is opened, the process tube 11 and load lock chamber 20 communicate with each other through the opening 20B. The other open end of the process tube 11 is provided with a gas supply section 11B and a gas exhaust section 11C. The gas supply section 11B communicates with a gas supplier (not shown) for supplying process gas into the process tube 11. The gas supplier contains, for example, oxygen gas, hydrogen gas, and water vapor as the process gas. The gas exhaust section 11C communicates with an exhaust device (not shown) for exhausting the process tube 11.

A holding member 12 is disposed in the process tube 11 and extends in a horizontal direction from the other open end of the process tube 11 toward a region irradiated with light beams from the lamps 13A. The end of the holding member 12 is interposed between the gas supply section 11B and gas exhaust section 11C and supported by a supporting member (not shown). The holding member 12 holds a semiconductor wafer W horizontally. The diameter of the wafer W is eight inches.

The load lock chamber 20 includes a carrying unit 21 for carrying the wafer W. The carrying unit 21 has an articulated arm supportably coupled to a drive shaft of a driving unit 21A. The driving unit 21A includes various mechanisms for rotating, expanding/contracting, and lifting/lowering the articulated arm. A fork 21B is attached to the end of the articulated arm. A recess for holding the wafer W is formed on the upper surface of the fork 21B.

Figure 3:
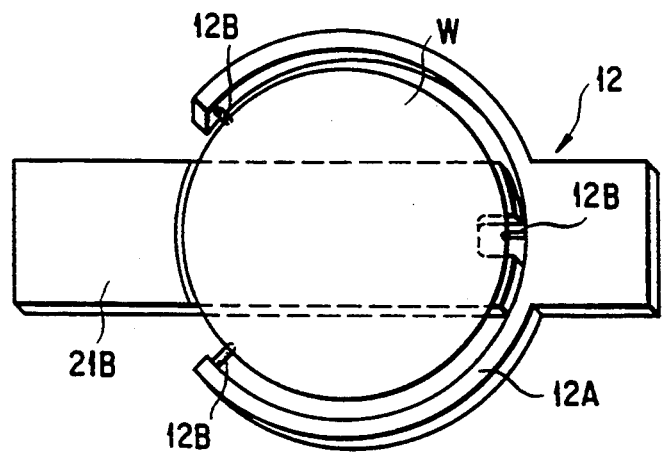
FIG. 3 is a perspective view of a holding member and a carrying arm between which a semiconductor wafer is transferred.

As shown in FIG. 3, the holding member 12 includes a ring-shaped main body 12A and three-supporting pins 12B. The end portion of the main body 12A is cut away so as not to interfere with the fork 21B, and its inside diameter is larger than the diameter of the wafer W. The pins 12B are projected inward from the main body 12A and contact the reverse of the wafer W in order to support the wafer W. The pins 12B are arranged at virtually regular intervals. The end portion of the fork 21B is partially cut away so as not to interfere with the pins 12B. The holding member 12 is made of a material having good heat ray absorption characteristics such as silicon carbide or graphite.

Two temperature regulation plates 15 and 16 are arranged in the process tube 11. While one temperature regulation plate 15 is provided above the wafer W, the other plate 16 is provided below the wafer W. The distance from the temperature regulation plate 15 to the upper surface of the wafer W is substantially the same as that from the temperature regulation plate 16 to the reverse of the wafer W, and it is set to 2 to 40 mm. It may be advantageous to narrow the distances as much as possible, in order to uniform the distribution of temperatures of the wafer W. However, in order to improve the efficiency of reaction of the process gas to the wafer W, it is advantageous to broaden them as much as possible. It is therefore desirable to set a distance between the wafer W and each of the temperature regulation plates 15 and 16 to at least 2 mm.

It is desirable that the temperature regulation plates 15 and 16 be formed of a material which is easy to absorb infrared rays having a long wavelength, for example, silicon carbide, graphite, or silicon. This is because a plate made of silicon carbide, graphite, or silicon does not cause any foreign objects which are to contaminate the wafer W. Furthermore, the thickness of each temperature regulation plate 15, 16 is set to 0.5 mm to 5 mm to minimize a heat capacity. A silicon carbide plate having a thickness of 1 to 2 mm is the most favorable for the temperature regulation plates 15 and 16. The shapes of the plates 15 and 16 are not limited, but it is desirable that they be rectangular or circular. In the first embodiment, the temperature regulation plates are arranged on both sides of the wafer W. However, a temperature regulation plate can be arranged on one side of the wafer W.

The lamps 13A of the heating units 13 are arranged at substantially regular pitches. While one row of the lamps 13A is arranged at regular intervals above the process tube 11, the other row of the lamps 13A is arranged at regular intervals below the process tube 11. A power supply (not shown) of the upper lamps 13A is connected to a first controller 31, and that (not shown) of the lower lamps 13A is connected to a second controller 32.

The first and second controllers 31 and 32 are connected to a CPU (or temperature profile controller) 30 to receive a temperature profile signal $S_1$ therefrom. The temperature profile signal $S_1$ is supplied in response to data input in accordance with the temperature profiles of the temperature regulation plates 15 and 16 and the wafer W. This data corresponds to the results of measurement obtained in advance using a dummy wafer which are input to the memory of the CPU 30.

A temperature sensor 18 is attached to the temperature regulation plate 15, and a temperature detection signal $S_2$ is supplied to the first controller 31. Similarly, a temperature sensor 19 is attached to the temperature regulation plate 16, and a temperature detection signal $S_2$ is supplied to the second controller 32. Thermocouples are used for the temperature sensors 18 and 19. In FIG. 1, these sensors 18 and 19 are attached to the ends of the temperature regulation plates 15 and 16, respectively. However, sensors 18 and 19 can be attached to the other portions of the plates 15 and 16, e.g., the middle portions thereof.

Upon receiving the temperature detection signals $S_2$ from the temperature sensors 18 and 19, the controllers 31 and 32 compare them with the temperature profile signals $S_1$ to control the amount of power supplied to the lamps 13A.

Each of the cooling units 14 has a main member 14A in which a refrigerant circulating pass 14B is formed. The pass 14B communicates with a coolant supplier (not shown). The first and second controllers 31 and 32 are connected to the flow rate control valves of the coolant suppliers to restrict the amount of coolant supplied to the passes 14B, respectively. The main members 14A are made of a material which is easy to absorb heat rays, such as silicon carbide, graphite, or silicon. Further, a reflection surface 13D is formed on each main member 14A to reflect the light beams emitted from the lamps 13A. The reflection surfaces 13D allow the heat rays radiating from the lamps 13A to be concentrated upon the process tube 11 with efficiency.

Since the heat capacities of the temperature regulation plates 15 and 16 are small, they are highly responsive to heat. If the entire surfaces of the plates 15 and 16 uniformly absorb the heat rays radiating from the lamps 13A, the temperatures of the plates are increased quickly in accordance with a predetermined temperature profile. If the cooling units 14 absorb the heat of the plates, the temperatures are decreased quickly in accordance with the temperature profile. The temperature profile is set by the distances between the wafer W and plate 15 and between the wafer W and plate 16 and the heat treatment conditions of the wafer W.

Figure 4:
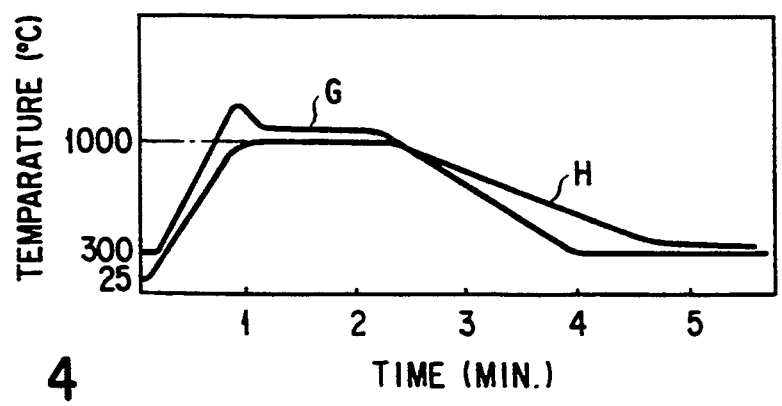
FIG. 4 is a graph showing a set temperature profile of a temperature regulation plate and a set temperature profile of a semiconductor wafer.

FIG. 4 is a graph showing the results of measurement obtained with respect to the temperature profile of the wafer W (dummy wafer) and that of the temperature regulation plates 15 and 16, in which an abscissa indicates time and an ordinate indicates temperature. In this graph, a curve G represents a temperature hysteresis of the plates 15 and 16 heated by the heating units 13 and cooled by the cooling units 14, and a curve H shows a temperature hysteresis of the wafer W. As is apparent from FIG. 4, the temperature regulation plates 15 and 16 have to be heated to the temperature exceeding 1000° C. in order to increase the wafer W to the process temperature of 1000° C. The wafer W is heated by the heat radiating from the plates 15 and 16 and the convective gas flowing therebetween. The temperature of each of the temperature regulation plates 15 and 16 exceeds 1000° C. about one minute after the respective lamps 13A are lit, and the temperature of the wafer W is kept at about 1000° C. The heating units 13 are stopped, and the cooling units 14 are started to operate about two and a half minutes after that. The main members 14A are then cooled and absorb the heat radiating from the temperature regulation plates 15 and 16. After a lapse of about four minutes, the temperatures of the regulation plates 15 and 16 are returned to their initial state.

Since the wafer W is cooled by the temperature regulation plates 15 and 16, its temperature decreases more gently than those of the plates do. Since the temperature of the wafer W reaches about 300° C. after a lapse of about five minutes, the annealing treatment is completed. After that, the gate valve 23 is opened, and the wafer W is returned to a predetermined location through the load lock chamber 20. By doing so, the subsequent semiconductor wafers W are repeatedly treated by the above process.

Figure 5:
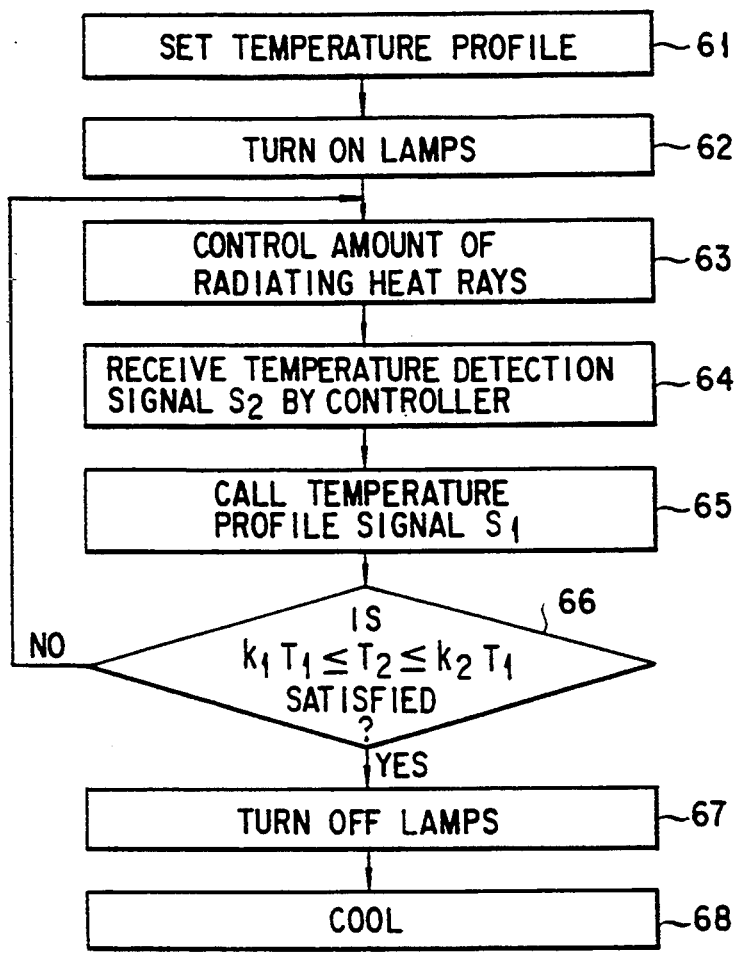
FIG. 5 is a flowchart showing an operation of the heat treatment apparatus of FIG. 1.

An operation of annealing a semiconductor wafer W in an atmosphere of nitrogen using the heat treatment apparatus 10, will now be described, with reference to the flowchart of FIG. 5.

The temperature profile data of a dummy wafer and that of a temperature regulation plate are acquired and input to the memory of the CPU 30 (step 61). A ROM of the CPU 30 previously stores a predetermined formula. If the temperature profile data is input, the CPU 30 calls the formula and converts the temperature profile data into a signal. This signal is supplied to the controller 32 as a temperature profile signal $S_1$.

The gate valve 22 is opened, and the wafer W is carried by the carrying unit 21 from the process chamber (not shown) into the load lock chamber 20. The gate valve 22 is then closed, and the load lock chamber 20 is exhausted by an exhaust section 20D, while a nitrogen gas is supplied from a gas supply section 20C to fill the load lock chamber with an atmosphere of nitrogen. At the same time, the process tube 11 is also filled with an atmosphere of nitrogen by substituting a nitrogen gas. After that, the gate valve 23 is opened, the wafer W is placed on the holding member 12 in the process tube 11.

The gate valve 23 is then closed, and the lamps 13A are turned on to irradiate the temperature regulation plates 15 and 16 with the light beams (heat rays) from the lamps (step 62). The plates 15 and 16 absorb the heat rays and their temperatures are increased. The plates 15 and 16 are substantially uniformly heated up to a temperature which is slightly higher than the process temperature. Heat rays radiate from the plates 15 and 16 toward the wafer W, and the temperature of the wafer W is increased by absorption of the heat rays.

Moreover, the nitrogen gas in the process tube 11 is heated by the radiating heat rays, and the heated gas convects in the process tube 11. The temperature regulation plates 15 and 16 and wafer W increase in temperature in contact with the heated gas. The plates 15 and 16 are heated quickly since they have a small heat capacity and an excellent heat ray absorptivity.

The first and second controllers 31 and 32 control the amount of heat rays radiating from the lamps 13A (step 63). First this amount is set on the basis of only the temperature profile data. Then it is finely controlled so as to obtain the optimum value, in accordance with the feedback control loop used in steps 63 to 66 which will be described later.

The first and second controllers 31 and 32 receive temperature detection signals $S_2$ from the temperature sensors 18 and 19, respectively (step 64). The controllers 31 and 32 call temperature profile signals $S_1$ (step 65). Then the CPU 30 or each of the controllers 31 and 32 determines whether the following inequality (1) is satisfied or not (step 66), $$k_1 T_1 \leq T_2 \leq k_2 T_1 \qquad (1)$$

where $T_1$ is a target temperature set by the temperature profiles of the temperature regulation plates, $T_2$ is a temperature measured based on the temperature detection signals $S_2$ of the temperature regulation plates, and $k_1$ and $k_2$ are correction coefficients (constants).

If the determination result is NO, the steps 63 to 66 are repeated until the measured temperature $T_2$ satisfy the above inequality (1). If the determination result is YES, the lamps 13A are turned off (step 67). The temperature regulation plates 15 and 16 are then cooled by the cooling units 14 (step 68).

According to the first embodiment, since the wafer W is heated indirectly through the temperature regulation plates 15 and 16, the entire wafer W can be heated uniformly and quickly, irrespective of the conditions of the surface of the wafer W.

The temperatures of the temperature regulation plates 15 and 16 vary with the temperature profiles, since they are detected by the temperature sensors 18 and 19 and the amount of radiating heat rays is feedback-controlled based on the detected temperatures.

Since, furthermore, the wafer W is interposed between the temperature regulation plates 15 and 16, the temperature of the wafer W can be controlled with high precision, even though the wafer W is slightly shifted from a predetermined position.

A heat treatment apparatus according to a second embodiment of the present invention will now be described, with reference to FIGS. 6 and 7.

Figure 6:
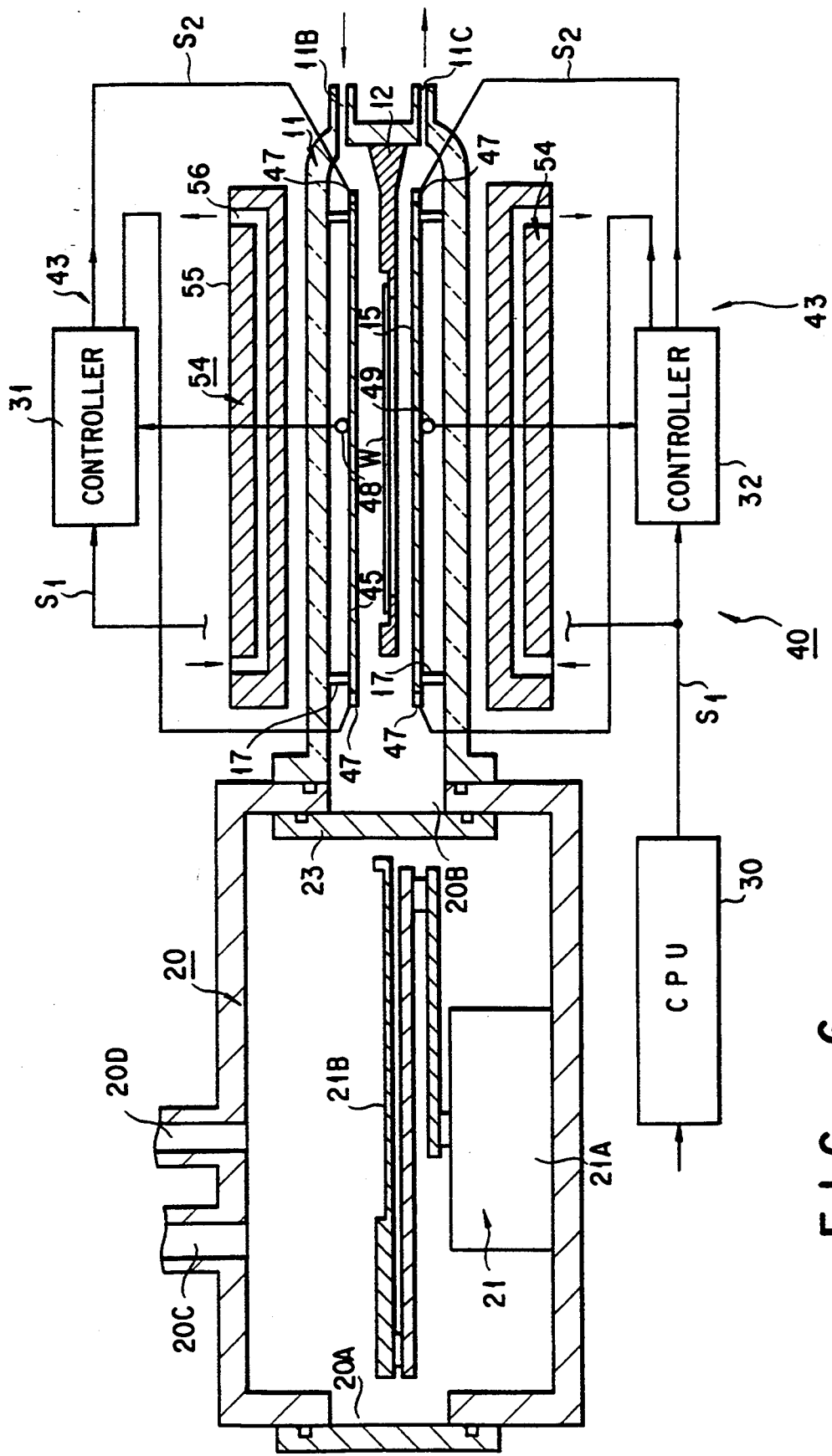
FIG. 6 is a cross-sectional block diagram showing a heat treatment apparatus according to a second embodiment of the present invention.

As shown in FIG. 6, a heat treatment apparatus 40 includes heating units 43, and the heating units 43 do not have lamps but temperature regulation plates 45 and 46 as heating sources. A wafer W is thus heated directly by the temperature regulation plates 45 and 46. Temperature sensors 48 and 49 are attached to the central parts of the plates 45 and 46, respectively. While the temperature sensor 48 is connected to a first controller 31, the temperature sensor 49 is connected to a second controller 32. Thermocouples are used for the temperature sensors 48 and 49.

Figure 7:
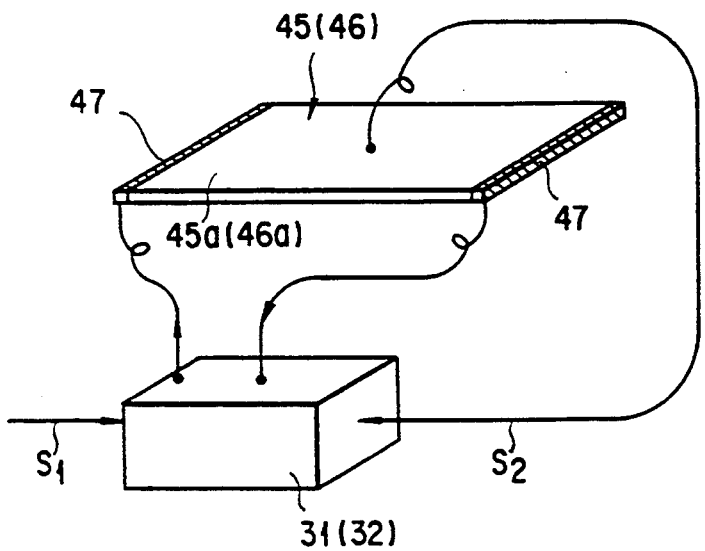
FIG. 7 is a perspective view schematically showing a heating unit provided in the heat treatment apparatus of FIG. 6.

As shown in FIG. 7, the temperature regulation plate 45 includes a resistance heating element 45a and a pair of conductive sections 47. The conductive sections 47 are linearly shaped and attached to both ends of the resistance heating element 45a. The element 45a is made of silicon carbide, graphite, silicon, or the like, and can be covered with a thermal good conductor.

The conductive sections 47 are made of high-melting metal such as tungsten or tantalum etc., and connected to a power supply (not shown) housed in the first controller 31. If a current flows through the conductive sections 47, it flows through the entire surface of the resistance heating element 45a. Therefore, the element 45a is uniformly heated and its temperature is increased accordingly.

In the second embodiment, the manufacturing costs can be reduced by the simple construction of the heating units 43. Furthermore, since the wafer W is directly heated by the temperature regulation plates 45 and 46 in the process tube 11, the heat treatment of the wafer W can be carried out quickly.

In the above embodiments, the heat treatment apparatus is applied to the annealing treatment. However, it can be widely applied to heat treatment such as thermal diffusion, oxidation, and CVD.

In the above embodiments, a temperature regulation plate is disposed on each side of the wafer W. However, a single temperature regulation plate can be disposed on only one side of the wafer W.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A heat treatment apparatus for rapidly heating semiconductor wafers one by one, comprising:
    a process tube which permits transmitting heat rays;
    a holding member for holding a wafer to be treated in said process tube;
    transfer means for moving wafers into and out of said process tube;
    a temperature regulation plate arranged close to the wafer held by said holding member in a manner to face said wafer for regulating the amount of the heat rays arriving at the wafer;
    heating means for heating said temperature regulation plate when the wafer is transferred into the process tube by said transfer means;
    cooling means for cooling the wafer after the heating step performed by said heating means;
    temperature detecting means for detecting the temperature of the temperature regulation plate; and
    control means for controlling said heating means in the heating step based on temperature profiles (changes with time in temperature) of the temperature regulation plate and a dummy wafer, said temperature profiles being determined and stored in advance, and the detected temperature of the temperature regulation plate.

2. The heat treatment apparatus according to claim 1, wherein said temperature regulation means has two plates facing both sides of the object, respectively, in such a manner that the object is interposed between said two plates.

3. The heat treatment apparatus according to claim 1, wherein said temperature regulation means is made of a material which is easy to absorb infrared rays having a long wavelength.

4. The heat treatment apparatus according to claim 1, wherein said temperature regulation means is made of a material selected from the group consisting of silicon carbide, graphite, and silicon.

5. The heat treatment apparatus according to claim 1, wherein said process tube is made of substantially transparent quartz.

6. The heat treatment apparatus according to claim 1, wherein said temperature regulation means generates heat.

7. The heat treatment apparatus according to claim 1, wherein said temperature regulation means includes a resistance heating element.

8. The heat treatment apparatus according to claim 1, wherein said control means controls said heating means based on the temperature profile of said temperature regulation plate such that the temperature regulation plate is heated to a temperature higher than a target temperature of the wafer in the heating step.

9. The heat treatment apparatus according to claim 1, wherein said control means controls said heating means based on the temperature profile of said temperature regulation plate such that the temperature regulation plate is heated to at least 1,000° C.

10. The heat treatment apparatus according to claim 1, wherein said temperature regulation plate is disposed at least 2 mm apart from the wafer held by said holding member.

11. The heat treatment apparatus according to claim 2, wherein one of said temperature regulation plates is controlled by first control means, with the other temperature control plate being controlled by second control means.

12. The heat treatment apparatus according to claim 4, wherein said temperature regulation plate has a thickness of 0.5 to 5.0 mm and a surface area larger than at least that of an 8-inch wafer.

13. The heat treatment apparatus according to claim 4, wherein said temperature regulation plate has a thickness of 1.0 to 2.0 mm and a surface area larger than at least that of an 8-inch wafer.

14. The heat treatment apparatus of claim 9, wherein:
   said temperature regulation plate is separated from the wafers during heat treatment in a range of 2–40 mm for uniformly transferring heat to the wafers and allowing sufficient room for the wafers to react with process gases.

* * * * *